(12) United States Patent
Zhang et al.

(10) Patent No.: US 6,235,122 B1
(45) Date of Patent: *May 22, 2001

(54) CLEANING METHOD AND CLEANING APPARATUS OF SILICON

(75) Inventors: Hongyong Zhang; Masayuki Sakakura; Yuugo Goto, all of Kanagawa (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,813

(22) Filed: Jun. 24, 1998

(30) Foreign Application Priority Data

Jun. 27, 1997 (JP) .................................... 9-187326

(51) Int. Cl.[7] .............................. B08B 3/08; B08B 5/00; H01L 21/00
(52) U.S. Cl. ................................ 134/2; 134/27; 134/28; 134/100.1; 134/102.3; 134/905; 118/715; 118/722
(58) Field of Search ................... 134/1.2, 2, 1.3, 134/26, 28, 30, 27, 905, 100.1, 102.1, 102.3; 118/715, 716, 722

(56) References Cited

U.S. PATENT DOCUMENTS

| 5,665,168 | * | 9/1997 | Nakano et al. | 134/2 |
| 5,783,790 | * | 7/1998 | Mitsumori et al. | 134/1.3 |
| 5,810,940 | * | 9/1998 | Fukazawa et al. | 134/2 |
| 5,944,907 | * | 8/1999 | Ohmi | 134/1.3 |
| 6,033,973 | * | 3/2000 | Takemura | 438/514 |

OTHER PUBLICATIONS

Partial Translation of Haruo Ito, Semiconductor World (monthly) 1996, pp. 92–94.

* cited by examiner

Primary Examiner—Randy Gulakowski
Assistant Examiner—Saeed Chaudhry
(74) Attorney, Agent, or Firm—Eric J. Robinson; Nixon Peabody LLP

(57) ABSTRACT

In a cleaning method and a cleaning apparatus of a silicon substrate, after wet cleaning or etching of the substrate having a silicon surface is carried out, and during or after a pure water rinse of the substrate, an oxide film with a thickness of 10 to 30 Å is formed on the silicon surface by rinsing the substrate by pure water added with an oxidizer, and then the substrate is dried. Since drying is carried out after the oxide film is formed on the silicon surface, the occurrence of a water mark can be prevented.

42 Claims, 4 Drawing Sheets

CLEANING METHOD AND CLEANING APPARATUS OF SILICON

BACKGROUND OF THE INVENTION

1. Field of the Invention

The present invention relates to a cleaning method and a cleaning apparatus of a semiconductor surface such as silicon surface, in which a residual water stain, the so-called water mark can be reduced in a step of drying silicon after wet cleaning or etching of a silicon surface.

2. Description of the Related Art

In the semiconductor industry using silicon, the material of silicon is classified into single crystal silicon, polycrystalline silicon, and amorphous silicon in view of the configuration. Silicon in any configuration has characteristics as a semiconductor, and plenty of raw material exists on earth. Thus, silicon is used in a wide field. The single crystal silicon is used for a memory such as a DRAM and EPROM or an arithmetic unit such as a CPU and MPU. The polycrystalline silicon is used for a switching transistor and a driving circuit of a liquid crystal display device, or a solar cell. The amorphous silicon is used for a switching transistor of a liquid crystal display device or a solar cell.

Among applications of each silicon, silicon is often used particularly for an integrated circuit using the function as a transistor. Especially, in the case where silicon is used for an integrated circuit, research and development competition are keen to make a clean environment or a micro machining apparatus and to develop material techniques, for the sensitivity of silicon to impurities and minute machining technique.

The technique of cleaning and etching is indispensable when silicon is used as a semiconductor. Cleaning is carried out in a wet mode in most cases. As the cleaning for removing physically adsorbed materials, there are scrub cleaning in which cleaning is carried out by scrubbing the surface by a brush or the like, ultrasonic cleaning or megasonic cleaning in which cleaning is carried out by the impact of compressed waves generated in pure water or a solution by ultrasonic waves, or the like. As the cleaning for removing organic materials attached to the surface, there is cleaning in which silicon is immersed in oxygenated water (hydrogen peroxide water) mixed with sulfuric acid to remove the organic materials by a chemical reaction, or the like. As the cleaning for removing metal contaminants, there is cleaning in which silicon is immersed in oxygenated water mixed with hydrochloric acid to remove the metal contaminants by a chemical reaction, or the like.

As to the etching, there are dry etching using a gas and wet etching using a solution. The wet etching using a solution is used for etching of the entire of a wide surface or for a case where a processed dimension is relatively large in semiconductor micro working.

As described above, in the semiconductor techniques, a wet process is often used in cleaning, etching, and the like in the present circumstances. In this wet process, a water mark is a serious problem. The water mark is such a phenomenon that when a substrate having a silicon surface is dried after wet cleaning or etching, a waterdrop adheres to the substrate surface during the period in which the state of the substrate is changed from a wet state to a dry state, and although the adherent waterdrop evaporate by drying, a mark of the waterdrop remains after the waterdrop disappears.

A suitable Japanese word for the water mark is not established for skilled persons in the art. Various expressions such as a water trace, waterdrop trace, or stain of water are used, and in the present specification, we uses the term of water mark. A definite technical interpretation is not established for what the water mark is, and there is no interpretation beyond the level of a hypothesis.

The following three elements are indispensable for the phenomenon in which the water mark is formed. They are (1) silicon, (2) oxygen, and (3) water. If even one of them is lacking, the water mark is not formed. FIG. 3 shows a commonly accepted theory (for example, Semiconductor World (monthly) 1996. 3, pages 92–94). In step a), oxygen in a dry atmosphere is dissolved in a waterdrop ($H_2O$ pure water) adherent to the surface of silicon. In step b), the dissolved oxygen is diffused into the interface between the silicon surface and the waterdrop. In step c), an oxide is formed on the silicon surface. In step d), the formed oxide dissolves into silicic acid (presumed to be $H_2SiO_3$). In step e), silicic acid is diffused in the liquid and is dissociated, and then it is further diffused. After the waterdrop is dried, the silicon oxide remains on the silicon surface, and this is regarded as the water mark.

If the water mark is once formed, it is extremely difficult to remove it, and substantially it is impossible to remove it. Thus, the water mark functions as a mask at subsequent etching of silicon, so that etching can not be made because of the water mark for a portion where etching is desired, or only partial etching can be made. As a result, silicon at the portion remains unetched.

The size and the number of water marks are greatly changed by conditions at the formation. The size is about 1 $\mu m\phi$ to 60 $\mu m\phi$, and the number is from several to one thousand or more on a substrate of 5 inches $\phi$ or 5 inches square. In some case, several water marks of several hundred $\mu m\phi$ are formed.

Since it is difficult to remove the water mark when it is once formed, it is important how to prevent the formation. Measures for preventing the formation of the water mark are summarized in the following two measures:

(1) To make the three elements of silicon, oxygen, and water become incomplete.

(2) Not to give a time for reaction (to make a time from water washing to drying as short as possible).

The measure (2) means instantaneous drying, and actually, there is a spin drying method in which a substrate is rotated to dry the substrate by using an air flow and centrifugal force. However, in this method, it is impossible to dry the substrate for such a short time that the water mark is not formed. Thus, the spin drying method is unsuitable for drying in the state where the three elements in the above measure (1) are complete.

As a method of realizing quick drying and eliminating water, there is an IPA (also called isopropyl alcohol, propyl alcohol, or propanol) vapor drying method. In this method, the IPA is heated to produce a vapor. When a substrate is placed in the IPA vapor filling a vessel in a drying apparatus, the vapor of IPA condenses on the substrate, and is replaced with water on the substrate in a short time. According to this IPA vapor drying method, since water and IPA are replaced with each other in a short time, water can be removed from the three elements of the measure (1), and short time drying of the measure (2) can be achieved at the same time. Thus, it is possible to prevent the formation of a water mark at a considerably high probability. Thus, the method is applied to almost all cases in current steps of using a silicon semiconductor.

As other recent methods, a drying system such as a Marangoni system or IPA direct substitution system is proposed, and such a system is actually used in some cases. In the Marangoni system, a substrate is pulled up slowly from pure water into the atmosphere of IPA and nitrogen, and the surface tension of pure water at that time is used. Similarly to the IPA direct substitution system, it can make the water mark zero in principle.

As a method of removing oxygen from the three elements for the formation of a water mark, there are proposed a method of drying a substrate in a nitrogen atmosphere in a closed system, a low pressure drying method of drying a substrate in a low pressure state, and the like. However, it is difficult to completely remove oxygen even in a carrier system in which a treatment is carried out in a state where a substrate is put in a normal carrier, or even in a closed space in a carrierless system (or single wafer processing type) in which only a substrate is processed without enclosing the substrate in a carrier, and it is also impossible to replace oxygen with other gas such as nitrogen in a short time. Also in the low pressure drying method, water and oxygen exist until a low pressure is achieved, so that it is very difficult to prevent the occurrence of a water mark also in this method.

The above described conventional methods of preventing the occurrence of a water mark are such that oxygen or water is removed from the three elements of silicon, oxygen and water for the occurrence of a water mark, or drying is carried out as quickly as possible. There is also a method of removing silicon from the three elements. When a natural oxide film exists on a silicon surface, the water mark is not formed (see the foregoing Semiconductor World 1996. 3, pages 92–94). However, in this method, it is important how to control a natural oxide film to make thin. An uncontrolled thick natural oxide film causes deterioration of a device. Moreover, the method can not be used in a step in which a trace of natural oxide film is not permitted.

As a method of forming a thin oxide film, there is known a chemical oxidation film producing method disclosed in "Ultra Clean ULSI Technique, Tadahiro Ohmi, Baifukan Co., page 214." This chemical oxidation film producing method is applied prior to a step of forming a gate oxide film on a silicon surface, which is especially important when an insulated gate field effect transistor is formed on silicon. In the formation of the gate insulating film, silicon oxide is formed on the silicon surface by using a thermal oxidizing method based on a dry oxidizing technique. Since a channel for flowing carriers is formed in the interface between the silicon oxide and silicon, an oxide film is formed to prevent the silicon surface from being polluted during the transfer to an oxidizing apparatus after cleaning the silicon surface.

Silicon on which the chemical oxidation film was formed is transferred to a thermal oxidizing step as it is, and a thermal oxidation film is formed on the chemical oxidation film. The chemical oxidation film becomes a part of the gate oxide film as it is. Accordingly, the step of forming the chemical oxidation film becomes complicated.

Table 1 shows the manufacturing procedure for forming the chemical oxidation film. The chemical oxidation film is formed through 5 wet steps and 1 dry step, that is, through 6 steps in total.

TABLE 1

| Treatment liquid | Composition | Used temperature | Treatment time |
|---|---|---|---|
| SPM | $H_2SO_4:H_2O_2 = 4:1$ | 120° C. | 5 minutes |
| $O_3/H_2O$ | Ultra pure water + $O_3$ (2 ppm) | Room temperature | 20 minutes |
| hot $H_2O_2$ | 30% $H_2O_2$ | 80–90° C. | 10 minutes |
| APM | $NH_4OH:H_2O_2:H_2O = 0.05:1:5$ | 80–90° C. | 10 minutes |
| HPM | $HCl:H_2O_2:H_2O = 1:1:6$ | 80–90° C. | 10 minutes |
| Low temperature oxidation | Dry $O_2$ | 300° C. | 20 minutes |

When the chemical oxidation film is formed on silicon after a cleaning step, it is possible to prevent the occurrence of a water mark. Since the chemical oxidation film is a precisely controlled oxide film, the film thickness is also controlled and few impurities are also included in the chemical oxidation film, unlike a natural oxide film.

However, when the step of forming this chemical oxidation film is introduced into all of the normal cleaning steps of silicon, the number of steps is greatly increased.

The present inventors paid attention to silicon among the three elements which should not be made complete in order to prevent the occurrence of a water mark. Since the steps of the method using a chemical oxidation film are complicated, the inventors considered forming a controlled oxide film by a simpler means. In general, a substrate is cleaned or etched, and is rinsed by pure water, and then drying is carried out. The inventors have found that a controlled thin oxide film can be formed on a silicon surface during the rinse or after the rinse before drying, and the present invention has been achieved.

SUMMARY OF THE INVENTION

An object of the present invention is therefore to provide a cleaning method in which in order to prevent the occurrence of a water mark, in a method of removing silicon from the three elements (silicon, oxygen, and water) for the occurrence of a water mark, without using complicated steps such as a step of forming a chemical oxidation film, and without using an uncontrolled natural oxide film, on the contrary, the natural oxide film is removed in view of subsequent steps and device characteristics, and on the silicon surface with no natural oxide film, a controlled oxide film is formed in pure water by a simple method during a pure water rinse or after the rinse after cleaning or etching, whereby the occurrence of a water mark at drying is prevented.

In order to achieve the above object, according to an aspect of the present invention, a cleaning method of silicon is characterized in that after a substrate having a silicon surface is wet cleaned, the silicon surface is rinsed by pure water, an oxide film with a thickness of 10 to 30 Å is formed on the silicon surface during the rinse or after the rinse before drying, and the silicon surface is dried.

According to another aspect of the present invention, a cleaning method of silicon is characterized in that after a substrate of silicon with a surface of a natural oxide film is subjected to wet etching to remove the natural oxide film, the silicon surface is rinsed by pure water, and an oxide film with a thickness of 10 to 30 Å is formed on the silicon surface during the rinse or after the rinse before drying, and then the silicon surface is dried.

According to still another aspect of the present invention, in a cleaning method of a substrate before a step in which amorphous silicon is irradiated with laser light to make polycrystalline silicon, a cleaning method of silicon is characterized in that after the substrate including amorphous silicon with a surface of a natural oxide film is subjected to wet etching to remove the natural oxide film, the surface of amorphous silicon is rinsed by pure water, an oxide film with a thickness of 10 to 30 Å is formed on the amorphous silicon surface during the rinse or after the rinse before drying, and the amorphous silicon surface is dried.

In the above cleaning method, it is preferable to form the oxide film with a thickness of 10 to 30 Å in a wet manner using pure water added with an oxidizer. It is preferable that the pure water added with the oxidizer is produced by such as adding ozone obtained by electrolysis of pure water into pure water, adding ozone obtained by ultraviolet irradiation to oxygen into pure water, or adding hydrogen peroxide of 5 to 20 vol % into pure water.

According to still another aspect of the present invention, a wet type silicon cleaning or etching apparatus comprises means for cleaning or etching silicon, means for rinsing a silicon surface by pure water, means for supplying pure water added with an oxidizer to the silicon surface, and means for spin drying the silicon surface, and is characterized in that before the silicon surface is dried by the means for spin drying, the pure water added with the oxidizer is supplied from the means for supplying the pure water.

In the foregoing silicon cleaning apparatus, it is preferable that the pure water added with the oxidizer is produced by such as adding ozone obtained by electrolysis of pure water into pure water, adding ozone obtained by ultraviolet irradiation to oxygen into pure water, or adding hydrogen peroxide of 5 to 20 vol % into pure water.

The present invention provides a cleaning method for preventing the occurrence of a water mark at drying and provides a cleaning apparatus for realizing the cleaning method, and is characterized in that in order to prevent the occurrence of a water mark, in a method of removing silicon from the three elements (silicon, oxygen, and water) for the occurrence of a water mark, on a silicon surface on which a natural oxide film does not exist, a controlled oxide film is formed in pure water by a simple method during or after a pure water rinse after cleaning or etching.

After wet cleaning or wet etching of silicon, a rinse by pure water is carried out to wash a cleaning liquid or etchant off from the silicon surface. During this rinse, pure water exists over the entire of silicon and the pure water flows, so that a water mark is not formed. That is, if a controlled oxide film is formed while silicon exists in the pure water after the achievement of the object of cleaning or etching, the occurrence of a water mark can be prevented.

By means of adding an oxidizer into pure water, a controlled oxide film as an object of the present invention is formed in pure water. At the cleaning of silicon, according to its object, there are cleaning for removing physical adsorbed materials, cleaning for removing adherent organic materials, cleaning for removing metal contamination, and the like. In any cleaning, a treatment solution for cleaning is used. In a wet etching step of silicon, an etchant is used as a treatment solution. In order to wash the cleaning solution or etchant off from the silicon surface, a rinse by pure water is carried out.

In the step of rinse by pure water, the type of rinse, time of rinse, and the quantity of pure water are different between a wet cleaning or etching step carried out for a substrate together with a carrier into which the substrate is put and a single wafer processing type in which only substrate is rinsed. However, there is a step for flowing pure water to wash off the solution remaining on the substrate surface for some constant time. In this rinse step, after the solution on the substrate surface is sufficiently washed off, an oxidizer is added into the pure water for rinse, and an oxide film is formed on the silicon surface. Alternatively, pure water for rinse is changed to pure water added with an oxidizer.

In the present invention, basically, instead of pure water used in a pure water rinse, pure water added with an oxidizer is flown similarly to the rinse of the substrate, so that an oxide film is formed. There was no concept before the present invention that in a cleaning step, drying is carried out after an oxide film is formed on a cleaned silicon surface.

As an oxidizer, as a result of various experiments through trial and error, the present inventors have reached the conclusion that an effect is obtained when an oxidizer obtained by adding ozone into pure water or by adding hydrogen peroxide into pure water is used. As a method of producing ozone, the following methods were tried: a method of producing ozone by electrolysis of pure water; a method of producing ozone by irradiation of ultraviolet rays to oxygen before bubbling in a system in which pure water is bubbled by oxygen; in the case of a single wafer processing type rinse, a method of producing ozone by irradiation of ultraviolet rays to pure water. As a result, it was found that any of the methods are effective.

DETAILED DESCRIPTION OF THE INVENTION

Figure 1A:
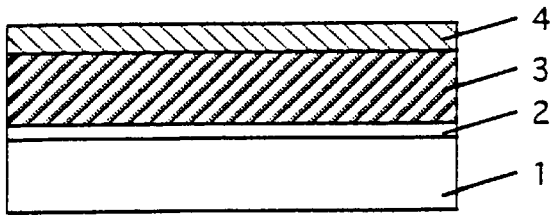
FIGS. 1A to 1E are views showing cleaning steps using the present invention.

A cleaning method of silicon of the present invention is applied to a step when cleaning of silicon or etching of silicon is carried out in a wet manner. First, a silicon surface is treated by a treatment solution for cleaning or etching of the silicon surface. Thereafter, after the object of the treatment is achieved (after a substance to be cleaned is removed, or after a substance to be etched is etched off), pure water is flown to wash off the solution on the silicon surface. In a single wafer processing type, pure water is flown in such a manner that the pure water is directly sprayed on the silicon surface to carry out a pure water rinse.

In a carrier system, a carrier is immersed in a vessel into which the entire carrier, on which a substrate having a silicon surface is mounted, can be put, and pure water is flown into the vessel to make an overflow, or many vessels are used in a cascade manner, so that a pure water rinse is carried out.

After the treatment solution is sufficiently washed off by the pure water rinse, a thin oxide film is formed on the silicon surface. If an oxide film is not formed in a state in which a sufficient amount of pure water remains on the silicon surface, a water mark is caused by the pure water rinse. In a single wafer processing type, pure water added with an oxidizer is sprayed on a silicon surface from a nozzle for spraying pure water added with an oxidizer next to a nozzle for spraying pure water for rinse on the silicon surface, and then the pure water for rinse is stopped and an oxide film formation step is carried out.

Alternatively, one nozzle is used and pure water connected to the nozzle is switched. The switching is instantaneously performed such that two systems of pure water and pure water added with an oxidizer are provided at the source side, and an electromagnetic valve, air differential valve, or the like is used for the switching to make instantaneous switching, so that an oxidizing step is carried out before a waterdrop is formed on the silicon surface.

In a carrier system, in addition to the vessel for carrying out the pure water rinse, a substrate together with the carrier is transferred into a vessel in which pure water added with an oxidizer is filled, so that an oxidizing step is carried out. The pure water added with an oxidizer in this vessel is made flow to the utmost so that fresh pure water added with an oxidizer can be always supplied.

As a method of adding an oxidizer into pure water, ozone produced by electrolysis of pure water is added by using a gas transmission film made of fluorine resin to form pure water added with ozone. Since ozone disappears by aging when a time elapses after the ozone is added into pure water, the pure water added with ozone must be used as quickly as possible. Thus, it is necessary to make contrivance so that fresh pure water added with ozone can always be produced at the side of a cleaning apparatus.

Pure water added with hydrogen peroxide of 5 to 20 vol % is also effective as pure water added with an oxidizer. Even if the amount of hydrogen peroxide is not larger than 5 vol %, although an oxide film is formed when a rinse oxidizing step is carried out for a sufficient time, a time of the step becomes too long. When the amount exceeds 20 vol %, an oxidizing speed becomes so high that the control of the film thickness of an oxide film becomes difficult. The amount of about 5 to 20 vol % is such that a very long time is not required and the oxidizing speed is not so fast.

In the case of a single wafer processing type, as a method of adding an oxidizer, an oxidizer can be added by using such a method that at the stage in which a solution has been washed off by rinse in a pure water rinse step, pure water for rinse is continued to flow and ultraviolet irradiation is carried out so that oxygen in the air is excited to generate ozone and the ozone is added into the pure water for rinse together with an air flow.

Since there is no fear that a water mark would occur on a substrate having a silicon surface on which an oxide film is formed (actually, a thin oxide film is already formed on the silicon surface), it is possible to dry the substrate by a conventional method such as an IPA vapor drying method or a spin drying method.

A cleaning apparatus for practicing the present invention in which after cleaning or etching, an oxide film is formed during the pure water rinse step or after the rinse step, and drying is carried out, can be realized by adding a means for supplying pure water added with an oxidizer to a conventional cleaning apparatus, so that it is possible to provide the cleaning apparatus for preventing the occurrence of a water mark by a simple means.

Embodiments of the present invention will be described with reference to the drawings.

[Embodiment 1]

In a step of making polycrystal by laser crystallization of amorphous silicon formed on a glass substrate, the present invention is used in a step of removing a natural oxide film formed on the amorphous silicon surface by wet etching before laser crystallization (FIGS. 1A to 1E show the steps of the present invention). FIGS. 2A to 2E shows steps for comparison in which the present invention is not used.

An underlayer silicon oxide film 2 with a thickness of 2000 Å is formed on a glass substrate 1 (#1737 made by Corning Inc. is used in this embodiment), an amorphous silicon film 3 with a thickness of 300 to 500 Å, typically 400 Å is formed thereon, and laser crystallization is carried out to the substrate. The amorphous silicon film 3 is formed by a plasma CVD method or a low pressure CVD method (LPCVD). The formation of a water mark is different by a method of formation of the amorphous film. The water mark is formed in a silicon film formed by the plasma CVD method more easily than in a silicon film formed by the low pressure CVD method. It is presumed that when the formed silicon surface is observed, the film formed by the plasma CVD method includes more cluster-like irregularities than the silicon surface formed by the low pressure CVD method, and this causes the difference in the formation of a water mark.

In this embodiment, since the present invention was practiced to the amorphous silicon formed by the plasma CVD method, further effects were obtained. Hydrogen of 5 to 30 atomic % is included in the amorphous silicon formed by the plasma CVD method. If laser crystallization is carried out while the hydrogen is included, the amorphous silicon absorbing the laser light is heated to release hydrogen abruptly, so that a number of holes like craters are formed.

Figure 2A:
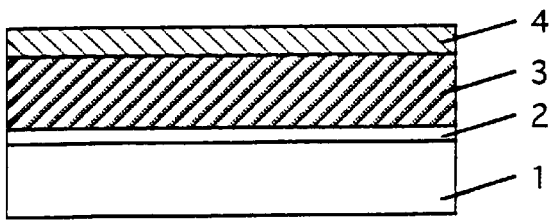
FIGS. 2A to 2E are views showing conventional cleaning steps.

Thus, in order to extract hydrogen in the amorphous silicon film 3 before the laser crystallization, a dehydrogenating step is carried out. The dehydrogenating step is such a step that a substrate is exposed in a nitrogen atmosphere of 350 to 450° C. for about 30 to 60 minutes so that hydrogen in the amorphous silicon film 3 is reduced to about 1 atomic %. Although this dehydrogenating step is carried out in a nitrogen atmosphere, a natural oxide film 4 is formed on the surface of the amorphous silicon 3 due to possibly the existence of a trace of oxygen or air (FIG. 1A, FIG. 2A).

Since this natural oxide film 4 is not controlled, the film thickness and impurities included therein are irregular. Thus, if laser crystallization is carried out while the natural oxide film 4 remains, absorption of laser light fluctuates depending on the film thickness of the natural oxide film 4, so that the degree of crystallization of silicon differs between places and between treatments. Further, impurities contained in the natural oxide film 4 are diffused into silicon.

It is necessary to remove the natural oxide film 4 before the step of laser crystallization. As a removing method, a spin etcher apparatus (made by Emusetech Co.) of single wafer processing type is used. This apparatus uses a spin drying method in which a substrate is rotated in a horizontal direction, etchant or pure water is sprayed on the rotating substrate from a nozzle, and nitrogen is sprayed on the rotating substrate to dry the substrate.

Figure 2B:
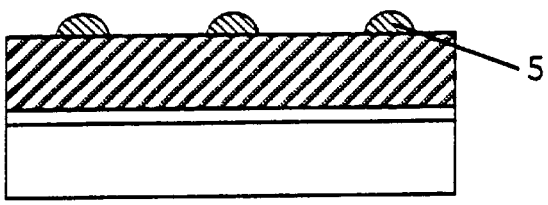
Figure 2C:
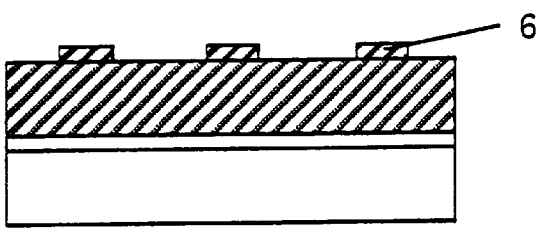

As the etchant for removing the natural oxide film 4, buffer hydrofluoric acid (in this embodiment, buffer hydrofluoric acid with a mixing ratio of hydrofluoric acid : ammonium fluoride=1:50 was used) is used and the natural oxide film 4 is removed in about 20 seconds. Since buffer hydrofluoric acid remains on the surface where the amorphus silicon film 3 is exposed, a rinse by pure water is carried out for 2 minutes to wash the remainder off. After the rinse is ended, if the substrate is dried by spin drying and is taken out, waterdrops 5 are formed during the spin drying as shown in FIG. 2B, and after they are dried, water marks 6 are formed as shown in FIG. 2C.

Figure 2D:
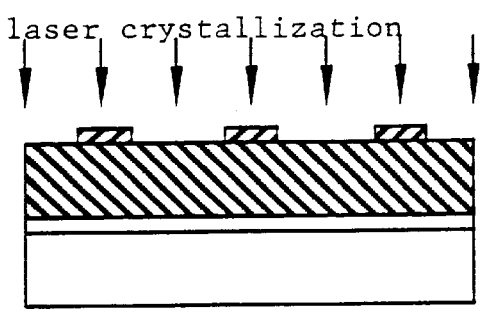
Figure 2E:
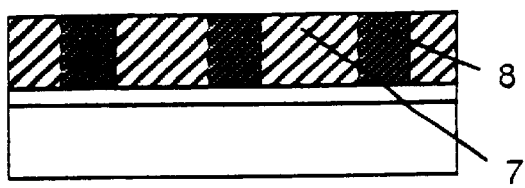
Figure 3A:
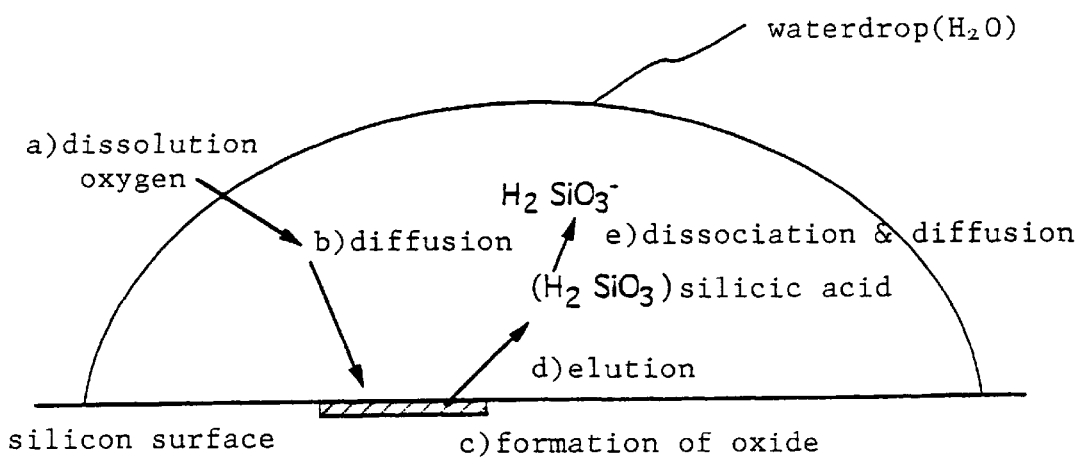
FIGS. 3A and 3B are views showing the principle of occurrence of a water mark.
Figure 3B:
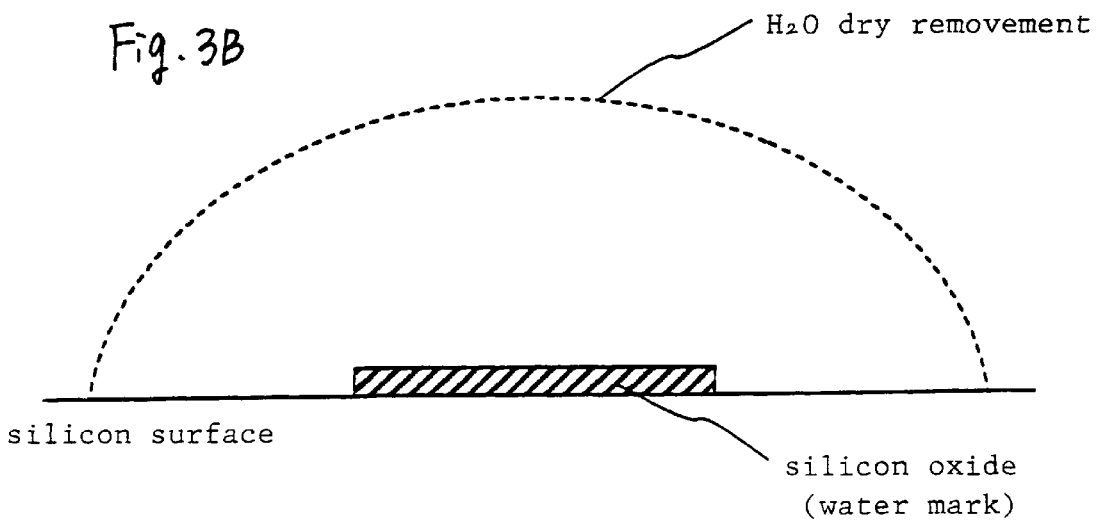

As shown in FIG. 2D, if laser crystallization of the amorphous silicon film 3 by excimer laser is carried out while the water mark 6 remains on the surface, since laser absorption at the portion where the water mark 6 exists is large, there are formed both an NG polycrystalline silicon region 8 having many ridges (the surface is considerably roughened) at the portion where the water mark 6 exists, and a polycrystalline region 7 at the portion where the water mark 6 does not exist, as shown in FIG. 2E.

The existence of the water mark 6 on a substrate after drying can not be recognized in almost all cases. This is because, as it is regarded, of very thin silicic acid. The existence of the water mark is not recognized until laser crystallization is carried out. After the laser crystallization, since many ridges exist on the surface of the NG polycrystalline silicon region 8, it is almost impossible to form a transistor in this region.

When the present invention is used, the same is the case with steps from a step where the natural oxide film 4 is removed to a step where a rinse by pure water is carried out. However, after the rinse is carried out for two minutes, pure water added with ozone is sprayed on the surface of the amorphous silicon film 3 from a nozzle for spraying pure water added with ozone, which is placed next to a nozzle for rinse, and pure water for rinse is stopped at the same time as or after the spray of pure water added with ozone. The rinse by pure water added with ozone is carried out for three minutes, and after an oxide film 9 with a thickness of about 10 Å is formed on the surface of the amorphous silicon 3, spin drying is carried out.

Figure 1B:
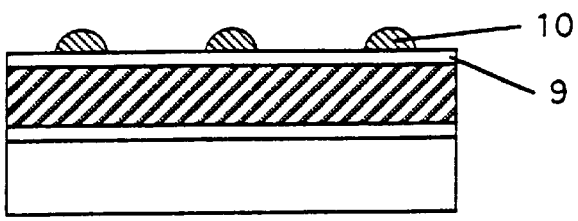
Figure 1C:
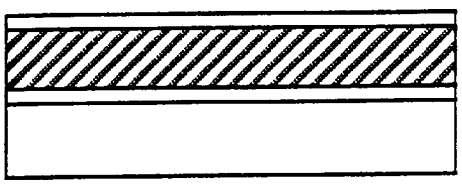
Figure 1D:
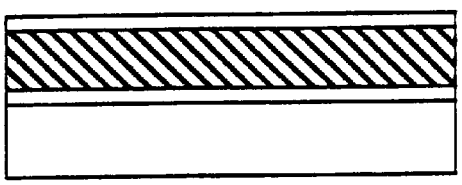
Figure 1E:
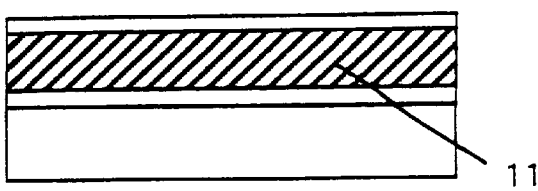

As shown in FIG. 1B, although a waterdrop 10 is formed during spin drying, a water mark is not formed after spin drying by the waterdrop 10 as shown in FIG. 1C. Thus, when the amorphous silicon 3 is crystallized by laser crystallization as shown in FIG. 1D into a polycrystalline silicon 11 as shown in FIG. 1E, the polycrystalline silicon 11 becomes a uniform polycrystalline film, so that the formation of a thin film transistor or the like is easy.

With respect to the oxide film formed on the silicon surface by pure water added with ozone, its film thickness can be made large by prolonging a rinse time by the pure water or by increasing the amount of ozone. Although it is possible to make the film thickness 30 Å or more, a long rinse time is required, and if the amount of ozone is increased, an oxidizing speed is increased so that the irregularity in film thickness among substrates is apt to occur. Accordingly, the thickness of 10 to 30 Å is suitable.

Specifically, it is suitable that the amount of addition of ozone is 3 to 10 ppm, and a rinse time is 2 to 5 minutes. In this embodiment, when the amount of addition of ozone is 5 ppm and a rinse time is 3 minutes, an oxide film with a thickness of about 10 Å is formed.

As an adding method of ozone, pure water added with ozone is produced by using ozone generated by electrolysis of pure water and a gas transmission film made of fluorine resin. This embodiment uses a hydroxydical production apparatus (UOW1A type) which can generate ozone of 6 mg/liter in the case of water of 2 liter/minute by a solid polymer electrolyte (SPE) water electrolysis method. In the case where ozone is not used, if hydrogen peroxide of 5 to 20% is added into pure water, a similar oxide film can be formed. However, when hydrogen peroxide is used, after the formation of an oxide film, the second rinse by pure water before drying is an indispensable step since active hydrogen peroxide remains on the surface.

[Embodiment 2]

Figure 4:
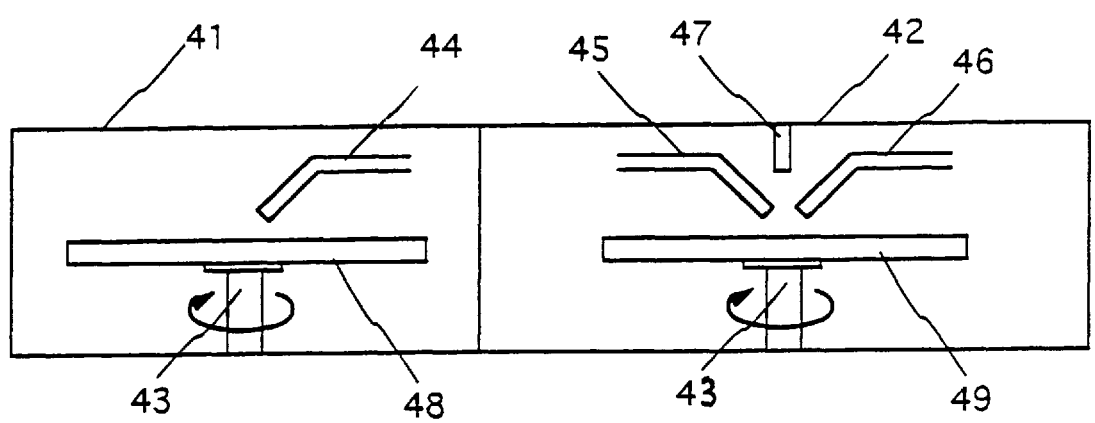
FIG. 4 is a view showing a cleaning apparatus using the present invention.

FIG. 4 shows a cleaning apparatus for practicing the present invention. The apparatus includes two chambers, that is, an etching chamber 41 in which a natural oxide film formed on the silicon surface is etched off, and a rinse chamber 42 in which a rinse by pure water, a rinse by pure water added with an oxidizer for forming an oxide film before drying according to the present invention, and drying are carried out.

A substrate 48 having a silicon surface is first rotated by a rotation mechanism 43 in the etching chamber while buffer hydrofluoric acid is sprayed from a nozzle 44. The buffer hydrofluoric acid extends on the entire surface of the rotating substrate 48, and the natural oxide film on the silicon surface is removed.

The substrate after completion of etching of the natural oxide film is transferred into the rinse chamber 42 in such a manner that the surface of the substrate is not dried. The transfer is carried out by means of underwater transfer or transfer in the spray of pure water. The substrate 49 is transferred into the rinse chamber 42, and pure water is sprayed from a pure water nozzle 46 on the rotating substrate 49. Since the substrate 49 is rotated by a rotating mechanism 43, pure water expands on the entire surface of the substrate. While pure water is sprayed from the pure water nozzle 46, pure water added with an oxidizer is sprayed on the substrate 49 from an oxidizing nozzle 45. Supply of pure water from the pure water nozzle 46 is stopped after 1 to 3 seconds since pure water added with an oxidizer was sprayed from the oxidizing nozzle 45. Then the formation of an oxide film by only pure water added with an oxidizer is carried out. Thereafter, the supply of pure water added with an oxidizer is stopped, and pure water is again sprayed from the pure water nozzle 46.

After the remaining pure water added with an oxidizer is washed off, the supply of pure water from the pure water nozzle 46 is stopped, and nitrogen is sprayed from a nitrogen nozzle 47 while the rotation speed of the substrate is raised, so that the substrate is spin dried.

Since the cleaning apparatus of the present invention can be constructed by merely adding one oxidizing nozzle 45 for supplying pure water added with an oxidizer, in addition to the pure water nozzle 46 for rinse in a conventional cleaning apparatus, the present invention can be achieved by only a simple modification of a conventional apparatus without introducing a new equipment. According to the cleaning apparatus for cleaning silicon of the present invention, it is possible to realize a cleaning apparatus capable of preventing the formation of a water mark by forming a thin oxide film on a silicon surface.

The present invention is carried out in the modes as described above, and has the following effects.

In a step of wet cleaning or wet etching to expose a silicon surface, the occurrence of a water mark which is otherwise formed by drying a substrate, can be prevented by a simple method in which a substrate is dried after a rinse of pure water added with an oxidizer is carried out so that an oxide film is formed on the silicon surface and silicon is removed from the three elements for the formation of a water mark.

When the present invention is applied to a laser crystallization process of an amorphous silicon, it is possible to crystalize amorphous silicon to uniform polycrystalline silicon having few ridges, and in a subsequent thin film transistor manufacturing step, the water mark does not become an obstacle. The thus obtained crystallized silicon film is suitable as an active region of a semiconductor device such as thin film transistor. Also, the laser crystallization described in the embodiment may be performed with respect to an already crystallized film.

What is claimed is:

1. A method for manufacturing a semiconductor device comprising the steps of:

forming a semiconductor film on an insulating surface;
wet cleaning a surface of said semiconductor film;
rinsing said surface by pure water after the wet cleaning;
forming an oxide film with a thickness of 30 Å or less on the surface during or after the rinsing step before drying in order to prevent a waterdrop from being formed on said surface;
drying the surface after the formation of said oxide film; and
crystallizing said semiconductor film by irradiating a laser light.

2. A method according to claim 1 wherein said semiconductor film comprises silicon.

3. A method according to claim 1 wherein said semiconductor film comprises amorphous silicon.

4. A method according to claim 1 wherein said oxide film is formed in a wet manner using pure water added with an oxidizer.

5. A method according to claim 4, wherein the pure water added with the oxidizer is produced by adding ozone obtained by electrolysis of pure water into pure water.

6. A method according to claim 4 wherein said pure water added with the oxidizer is produced by adding ozone obtained by ultraviolet irradiation to oxygen into pure water.

7. A method according to claim 4 wherein said pure water added with the oxidizer is produced by adding hydrogen peroxide of 5 to 20 vol % into pure water.

8. A method according to claim 1 further comprising a step of manufacturing a thin film transistor after crystallizing said semiconductor film.

9. A method for manufacturing a semiconductor device comprising the steps of:
forming a semiconductor film on an insulating surface;
wet etching a natural oxide film formed on a surface of said semiconductor film;
rinsing the surface of the semiconductor by pure water after said wet etching;
forming an oxide film with a thickness of 30 Å or less on said surface during or after the rinsing step before drying in order to prevent a waterdrop from being formed on said surface;
drying said surface after the formation of said oxide film; and
crystallizing said semiconductor film by irradiating a laser light.

10. A method according to claim 9 wherein said oxide film is formed in a wet manner using pure water added with an oxidizer.

11. A method according to claim 10, wherein the pure water added with the oxidizer is produced by adding ozone obtained by electrolysis of pure water into pure water.

12. A method according to claim 10 wherein said pure water added with the oxidizer is produced by adding ozone obtained by ultraviolet irradiation to oxygen into pure water.

13. A method according to claim 10 wherein said pure water added with the oxidizer is produced by adding hydrogen peroxide of 5 to 20 vol % into pure water.

14. A method according to claim 9 wherein said semiconductor film comprises amorphous silicon.

15. A method according to claim 9 further comprising a step of manufacturing a thin film transistor after crystallizing said semiconductor film.

16. A method for manufacturing a semiconductor device comprising the steps of:
forming a semiconductor film comprising amorphous silicon on an insulating surface;
wet etching a natural oxide film formed on the semiconductor film;
rinsing a semiconductor surface by pure water;
forming an oxide film on the semiconductor surface during or after the rinsing step before drying in order to prevent a waterdrop from being formed on said semiconductor surface;
drying the semiconductor surface after the formation of said oxide film; and
crystallizing said semiconductor film by irradiating a laser light.

17. A method according to claim 16 wherein said oxide film is formed in a wet manner using pure water added with an oxidizer.

18. A method according to claim 17, wherein the pure water added with the oxidizer is produced by adding ozone obtained by electrolysis of pure water into pure water.

19. A method according to claim 17 wherein said pure water added with the oxidizer is produced by adding ozone obtained by ultraviolet irradiation to oxygen into pure water.

20. A method according to claim 17 wherein said pure water added with the oxidizer is produced by adding hydrogen peroxide of 5 to 20 vol % into pure water.

21. A method according to claim 16 wherein said semiconductor film comprises amorphous silicon.

22. A method according to claim 16 further comprising a step of manufacturing a thin film transistor after crystallizing said semiconductor film.

23. A semiconductor device manufacturing apparatus for wet type semiconductor film cleaning or etching, comprising:
means for cleaning or etching a semiconductor surface;
means for rinsing said semiconductor surface by pure water;
means for supplying pure water added with an oxidizer to said semiconductor surface to form an oxide film on said semiconductor surface;
means for spin drying said semiconductor surface; and
means for irradiating said semiconductor surface with a laser light,
wherein before drying said semiconductor surface by the means for spin drying, the pure water added with the oxidizer is supplied from the means for supplying the pure water added with the oxidizer in order to prevent a waterdrop from being formed on said semiconductor surface.

24. An apparatus according to claim 23, wherein the pure water added with the oxidizer is one of pure water produced by adding ozone obtained by electrolysis of pure water into pure water, pure water produced by adding ozone obtained by ultraviolet irradiation to oxygen into pure water, and pure water produced by adding hydrogen peroxide of 5 to 20 vol % into pure water.

25. A method for manufacturing a semiconductor device comprising the steps of:
forming a semiconductor film comprising amorphous silicon on an insulating surface;
pre-heating said semiconductor film to remove a hydrogen in said semiconductor film;
etching a natural oxide film formed by said pre-heating step;
rinsing a surface of said semiconductor film by pure water;
forming a thin oxide film on said semiconductor film in order to prevent a waterdrop from being formed on said surface;

drying said surface after the formation of said oxide film; and crystallizing said semiconductor film by irradiating a laser light.

26. A method according to claim 25 wherein said pre-heating step is performed in nitrogen atmosphere.

27. A method according to claim 25 wherein said laser light comprises an excimer laser light.

28. A method according to claim 25 wherein buffer hydrofluoric acid is used for said etching.

29. A method according to claim 25 wherein said thin oxide film is formed in a wet manner using pure water added with an oxidizer.

30. A method according to claim 29 wherein said pure water added with the oxidizer is produced by adding ozone obtained by electrolysis of pure water into pure water.

31. A method according to claim 29 wherein said pure water added with the oxidizer is produced by adding ozone obtained by ultraviolet irradiation to oxygen into pure water.

32. A method according to claim 29 wherein said pure water added with the oxidizer is produced by adding hydrogen peroxide of 5 to 20 vol % into pure water.

33. A method according to claim 25 further comprising a step of manufacturing a thin film transistor after crystallizing said semiconductor film.

34. A method for manufacturing a semiconductor device comprising the steps of:

forming a semiconductor film comprising amorphous silicon on an insulating surface;

heating said semiconductor film;

etching a natural oxide film formed by said heating step;

rinsing a surface of said semiconductor film by pure water;

forming a thin oxide film on said semiconductor film in order to prevent a waterdrop from being formed on said surface; and driving said surface after the formation of said oxide film; and irradiating said semiconductor film with a laser light.

35. A method according to claim 34 wherein said heating step is performed in nitrogen atmosphere.

36. A method according to claim 34 wherein said laser light comprises an excimer laser light.

37. A method according to claim 34 wherein buffer hydrofluoric acid is used for said etching.

38. A method according to claim 34 wherein said thin oxide film is formed in a wet manner using pure water added with an oxidizer.

39. A method according to claim 38 wherein said pure water added with the oxidizer is produced by adding ozone obtained by electrolysis of pure water into pure water.

40. A method according to claim 38 wherein said pure water added with the oxidizer is produced by adding ozone obtained by ultraviolet irradiation to oxygen into pure water.

41. A method according to claim 38 wherein said pure water added with the oxidizer is produced by adding hydrogen peroxide of 5 to 20 vol % into pure water.

42. A method according to claim 34 further comprising a step of manufacturing a thin film transistor after said irradiating step.

* * * * *